(12) United States Patent
Huang et al.

(10) Patent No.: US 11,676,912 B2
(45) Date of Patent: Jun. 13, 2023

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Chia Hsiu Huang, Kaohsiung (TW); Chun Chen Chen, Kaohsiung (TW); Wei Chih Cho, Kaohsiung (TW); Shao-Lun Yang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 155 days.

(21) Appl. No.: 17/133,365

(22) Filed: Dec. 23, 2020

(65) Prior Publication Data

US 2022/0199552 A1     Jun. 23, 2022

(51) Int. Cl.
| | |
|---|---|
| *H01L 23/495* | (2006.01) |
| *H01L 23/00* | (2006.01) |
| *H01L 23/31* | (2006.01) |
| *H01L 23/498* | (2006.01) |
| *H01L 21/48* | (2006.01) |
| *H01L 21/56* | (2006.01) |

(52) U.S. Cl.
CPC ........ *H01L 23/562* (2013.01); *H01L 21/4853* (2013.01); *H01L 21/4857* (2013.01); *H01L 21/565* (2013.01); *H01L 23/3121* (2013.01); *H01L 23/49822* (2013.01); *H01L 23/49838* (2013.01); *H01L 24/32* (2013.01); *H01L 24/48* (2013.01); *H01L 24/73* (2013.01); *H01L 2224/32225* (2013.01); *H01L 2224/48227* (2013.01); *H01L 2224/73265* (2013.01)

(58) Field of Classification Search
CPC ... H01L 23/28; H01L 23/3121; H01L 23/562; H01L 23/49838
USPC .................................................. 257/704, 787
See application file for complete search history.

(56) References Cited

U.S. PATENT DOCUMENTS

| | | | | |
|---|---|---|---|---|
| 5,866,943 | A * | 2/1999 | Mertol ..................... | H01L 24/91 257/E23.101 |
| 5,872,700 | A * | 2/1999 | Collander ........... | H01L 23/5387 257/E25.011 |
| 6,147,401 | A * | 11/2000 | Solberg ................... | H01L 25/50 257/E21.705 |
| 6,369,455 | B1 * | 4/2002 | Ho ....................... | H01L 23/4334 257/730 |
| 6,720,649 | B2 * | 4/2004 | Huang ................. | H01L 23/4334 257/796 |
| 2008/0073778 | A1 * | 3/2008 | Edwards ............. | H01L 23/4334 257/E23.092 |
| 2012/0228696 | A1 | 9/2012 | Carpenter et al. | |

(Continued)

*Primary Examiner* — Nitin Parekh
(74) *Attorney, Agent, or Firm* — Foley & Lardner LLP

(57) ABSTRACT

A semiconductor device package and a method for manufacturing a semiconductor device package are provided. The semiconductor device package includes a substrate, a clip, and a support structure. The clip is disposed on the substrate. The clip includes a first portion and a second portion separated from each other by a slit. The support structure is above the substrate and supports the clip. The support structure has a first surface and a second surface facing the first surface, and the first surface and the second surface define a gap.

18 Claims, 15 Drawing Sheets

(56) References Cited

U.S. PATENT DOCUMENTS

| | | | |
|---|---|---|---|
| 2013/0322023 A1* | 12/2013 | Kim | H01L 23/4334 |
| | | | 361/720 |
| 2015/0382448 A1* | 12/2015 | Pennathur | H05K 1/0203 |
| | | | 361/679.54 |
| 2017/0194268 A1* | 7/2017 | Ho | H01L 24/17 |
| 2019/0088628 A1 | 3/2019 | Denison et al. | |

* cited by examiner

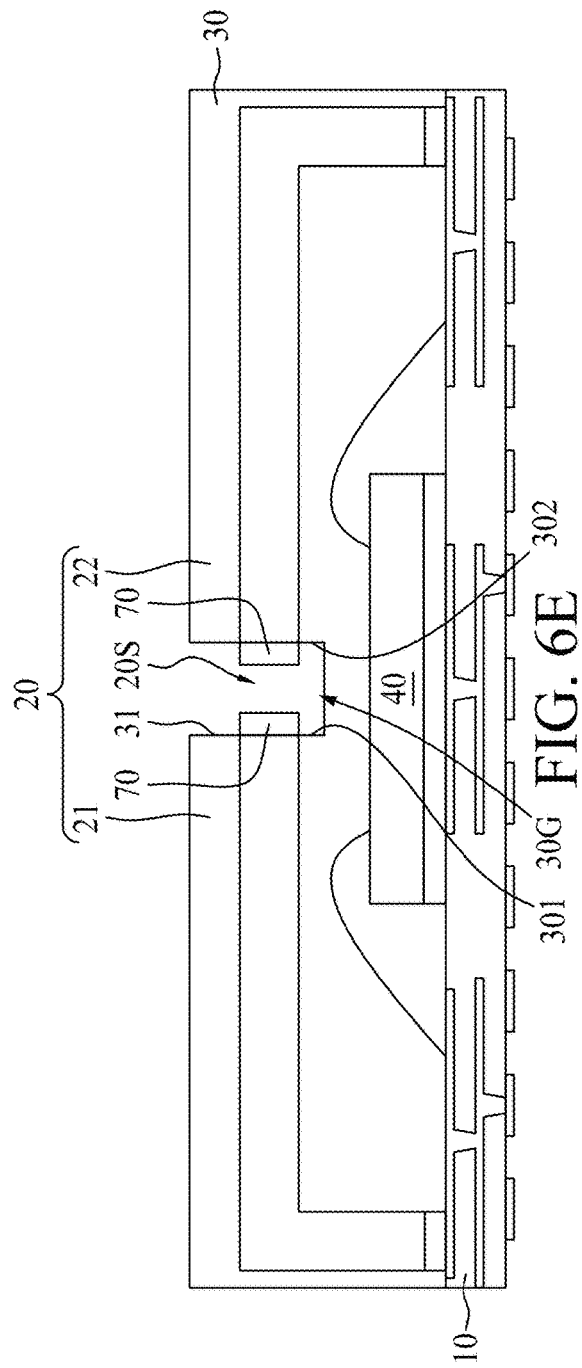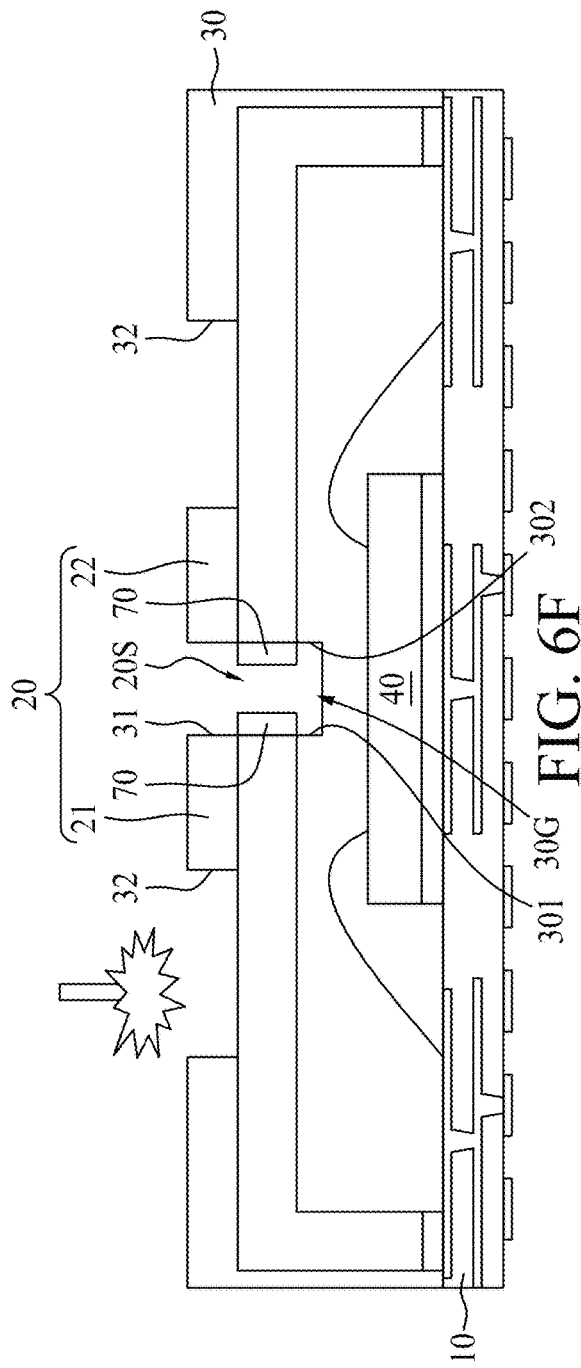

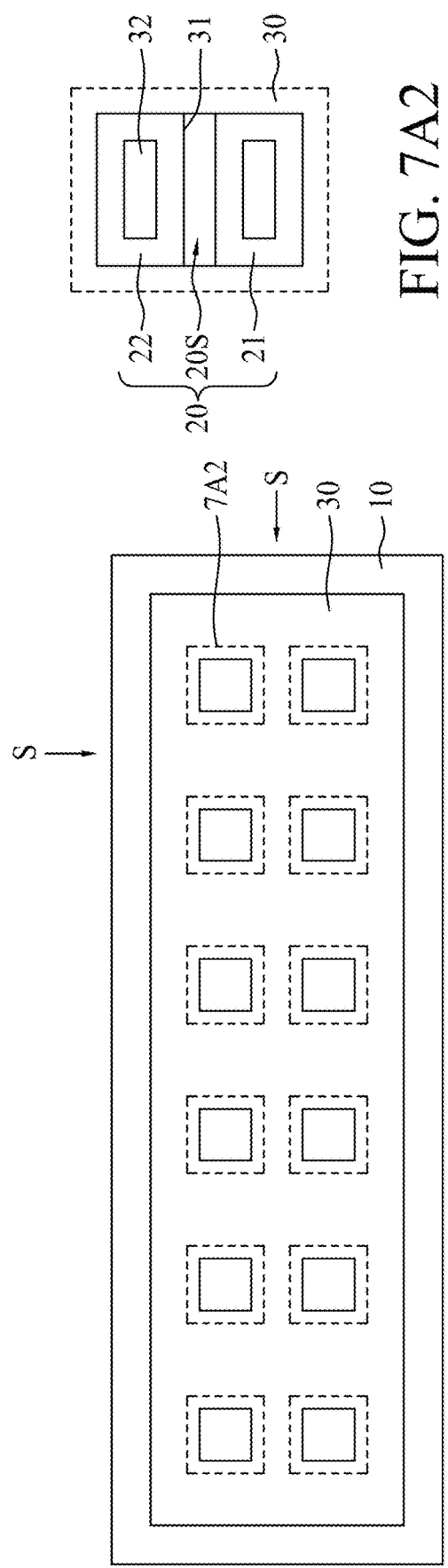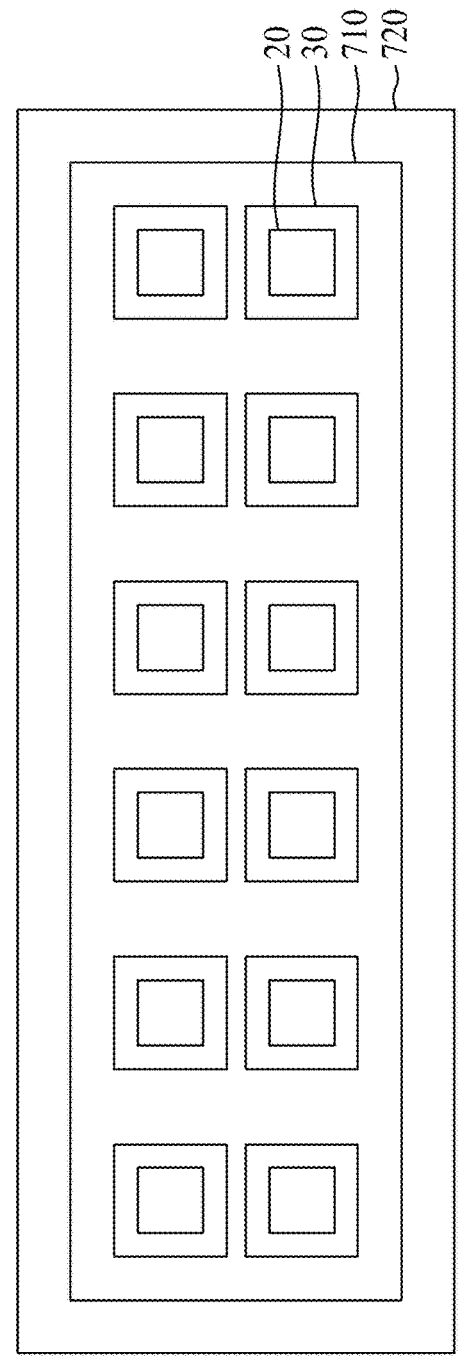

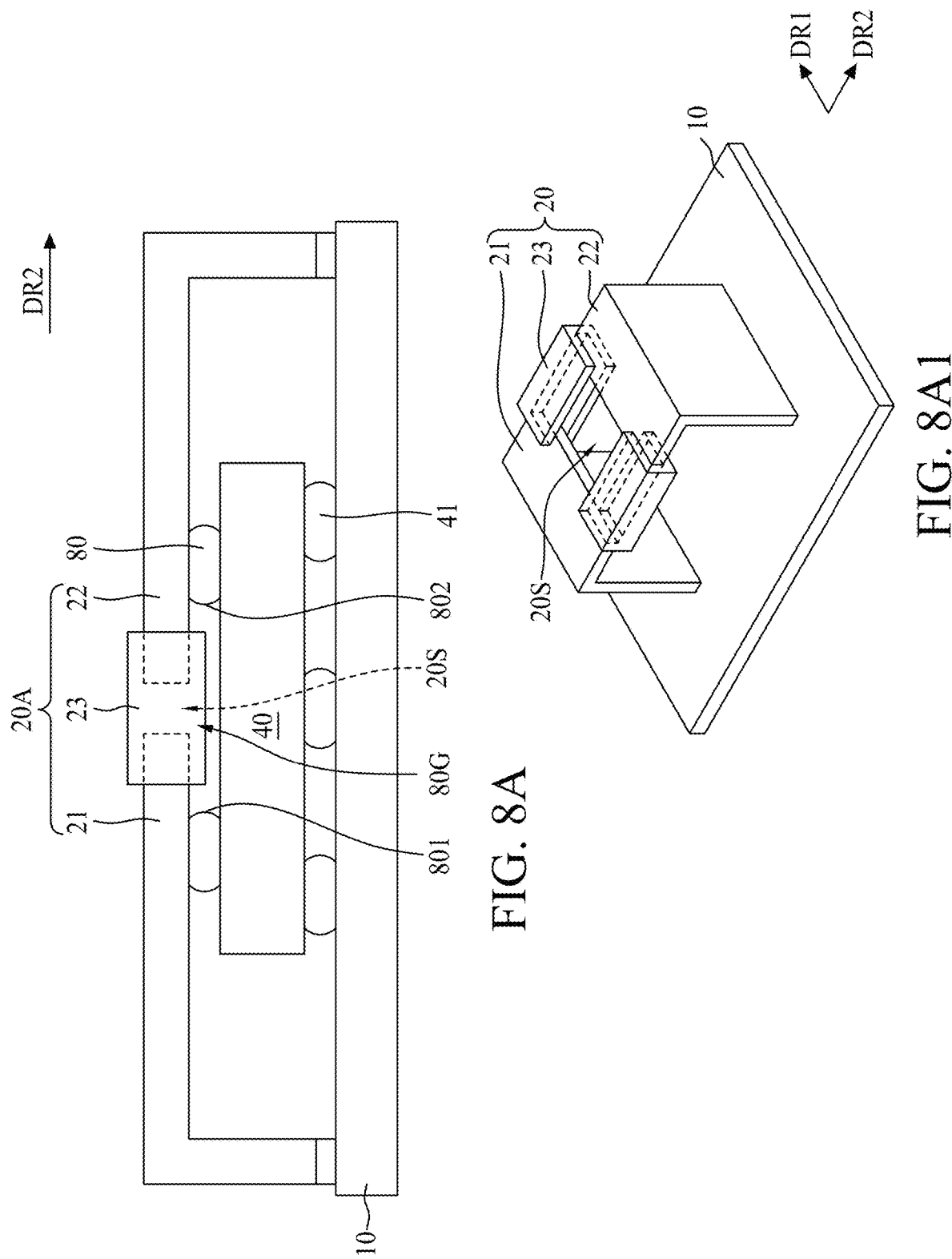

SEMICONDUCTOR DEVICE PACKAGE AND METHOD FOR MANUFACTURING THE SAME

BACKGROUND

1. Technical Field

The present disclosure relates generally to a semiconductor device package and a method for manufacturing a semiconductor device package, particularly to a semiconductor device package including a clip and a method for manufacturing a semiconductor device package including a clip.

2. Description of the Related Art

Passive components, e.g., inductors, normally have relatively large volumes and thus may play a major role in defining the overall size of a device package. In view of the above, passive components are usually stacked vertically over a substrate in order to reduce the package area size (i.e., along the x-y plane) of a device package. Conductive pins or posts are disposed directly under the passive components for electrically connecting the passive components to the substrate underneath. However, the aforesaid arrangement of the conductive pins or posts may undesirably occupy relatively large device areas and adversely affect the design flexibility of the substrate layout and the arrangements of electronic components.

SUMMARY

In one or more embodiments, a semiconductor device package includes a substrate, a clip, and a support structure. The clip is disposed on the substrate. The clip includes a first portion and a second portion separated from each other by a slit. The support structure is above the substrate and supporting the clip. The support structure has a first surface and a second surface facing the first surface, and the first surface and the second surface define a gap.

In one or more embodiments, a semiconductor device package includes a substrate, a clip, and an encapsulant. The clip is disposed on the substrate. The clip includes a first portion and a second portion separated from each other by a slit. The encapsulant is between the clip and the substrate. The first portion of the clip has a first surface facing the slit and substantially coplanar with a surface of the encapsulant.

In one or more embodiments, a method for manufacturing a semiconductor device package includes the following operations: providing a substrate; disposing an integrated clip on the substrate; and separating the integrated chip into a first clip portion and a second clip portion.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 6A, FIG. 6B, FIG. 6C, FIG. 6D, FIG. 6E, and FIG. 6F illustrate various operations in a method of manufacturing a semiconductor device package in accordance with some embodiments of the present disclosure;

FIG. 7A, FIG. 7A1, FIG. 7A2 and FIG. 7B illustrate various operations in a method of manufacturing a semiconductor device package in accordance with some embodiments of the present disclosure; and FIG. 8A, FIG. 8A1, FIG. 8B and FIG. 8C illustrate various operations in a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
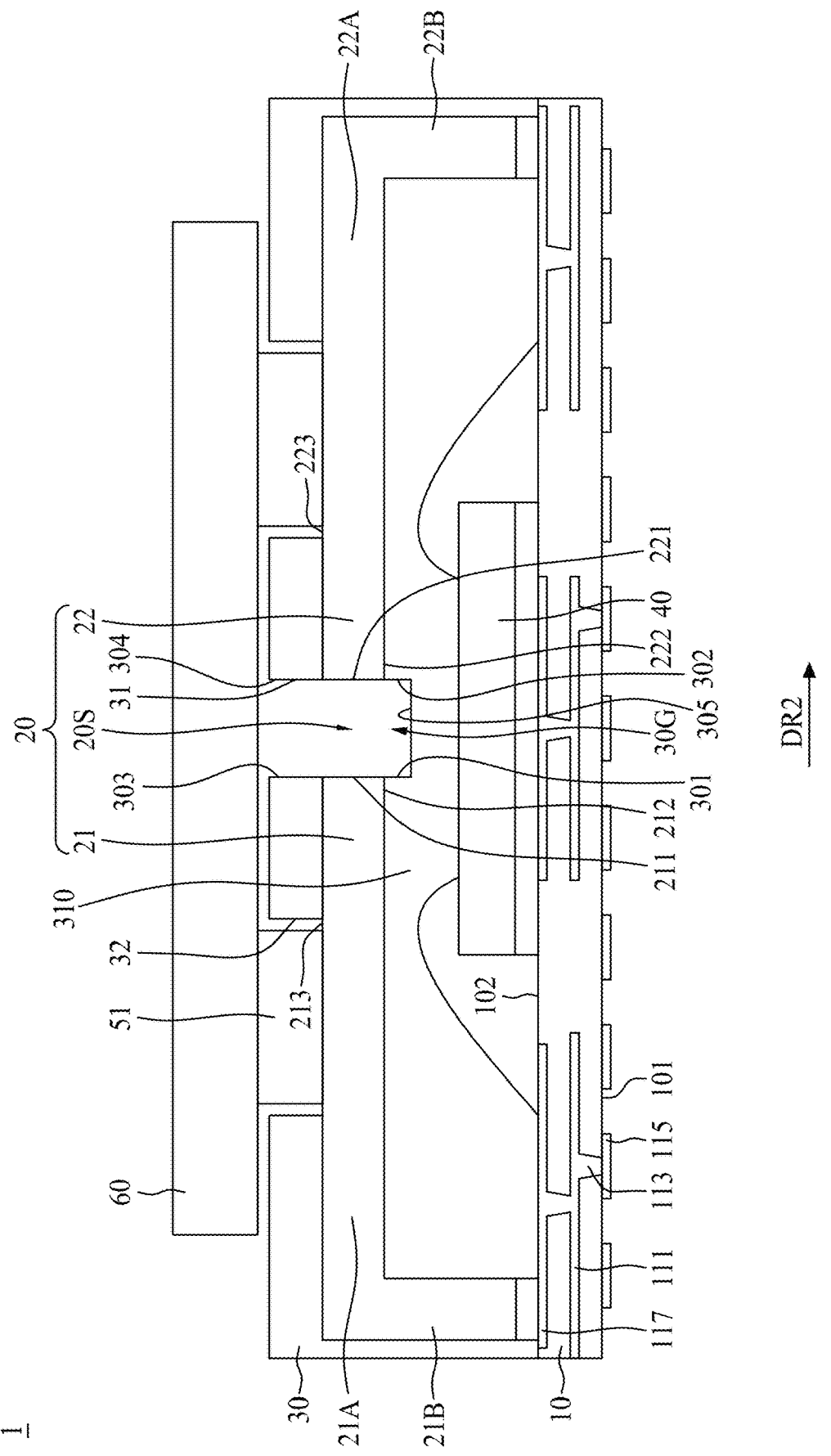
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a substrate 10, a clip 20, an encapsulant 30, electronic components 40 and 60, and conductive elements 51.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a plurality of conductive traces 111 (or redistribution layers (RDLs)) and one or more through vias 113. In some embodiments, the substrate 10 may include one or more conductive pads 115 in proximity to, adjacent to, or embedded in and exposed at a surface 101 (also referred to as "a bottom surface") of the substrate 10 for electrical connections. In some embodiments, the substrate 10 may include one or more conductive pads 117 in proximity to, adjacent to, or embedded in and exposed at a surface 102 (also referred to as "an upper surface") of the substrate 10 for electrical connections. In some embodiments, the substrate 10 includes a ceramic material or a metal plate. In some embodiments, the substrate 10 may include an organic substrate or a leadframe.

The clip 20 may be disposed on the surface 102 of the substrate 10. In some embodiments, the clip 20 includes a portion 21 and a portion 22 (also referred to as "clip portions") separated from each other by a slit 20S. In some embodiments, the portion 21 and the portion 22 of the clip 20 are bonded to the substrate 10 through adhesive layers or solder pads. In some embodiments, the portion 21 and the portion 22 of the clip 20 are bonded to the substrate 10 by surface mount technology (SMT). In some embodiments, the portion 21 of the clip 20 is electrically isolated from the portion 22 of the clip 20. In some embodiments, the portion 21 and the portion 22 are electrically connected to different conductive pads (or terminals) of the substrate 10. The portions 21 and 22 may serve to respectively electrical connect to two terminals of an electronic component disposed over the clip 20. In some embodiments, the clip 20 may be or include a conductive material such as a metal or metal alloy. Examples include gold (Au), silver (Ag), aluminum (Al), copper (Cu), or an alloy thereof. In some embodiments, the clip 20 may include N portions separated from each other, where N is an integer greater than 1.

According to some embodiments of the present disclosure, with the aforesaid design of the clip 20, the conductive pads (or terminals) of the substrate 10 that connect to the portions 21 and 22 of the clip 20 can be arranged on peripheral regions of the substrate 10 without adversely affecting the arrangement of electronic components on the substrate 10. Therefore, electronic components can be disposed on the substrate 10 directly under a relatively large area of the clip 20. Accordingly, the flexibility of the substrate layout is increased, the utilization of the substrate area can be increased as well, and the two portions 21 and 22 each connecting to one conductive pad (or terminal) of the substrate 10 on peripheral regions can provide sufficient support for the structural stability of the clip 20 and prevent the clip 20 from tilting. Thus, the reliability of the semiconductor device package 1 can be improved.

In some embodiments, the portion 21 of the clip 20 has a surface 211 facing the slit 20S and surfaces 212 and 213 angled with the surface 211. In some embodiments, a surface roughness of the surface 211 of the portion 21 of the clip 20 is greater than a surface roughness of the surface 212 of the portion 21 of the clip 20. In some embodiments, the surface roughness of the surface 211 of the portion 21 of the clip 20 is greater than a surface roughness of the surface 213 (also referred to "the upper surface") of the portion 21 of the clip 20. In some embodiments, the portion 22 of the clip 20 has a surface 221 facing the slit 20S and surfaces 222 and 223 angled with the surface 221. In some embodiments, a surface roughness of the surface 221 of the portion 22 of the clip 20 is greater than a surface roughness of the surface 222 of the portion 22 of the clip 20. In some embodiments, the surface roughness of the surface 221 of the portion 22 of the clip 20 is greater than a surface roughness of the surface 223 (also referred to "the upper surface") of the portion 22 of the clip 20.

In some embodiments, the surface 211 of the portion 21 of the clip 20 and the surface 221 of the portion 22 of the clip 20 define the slit 20S. In some embodiments, the surface 211 of the portion 21 of the clip 20 is conformal with the surface 221 of the portion 22 of the clip 20.

In some embodiments, the portion 21 includes a sub-portion 21A and a sub-portion 21B connected to the sub-portion 21A. In some embodiments, the sub-portion 21A is angled with the sub-portion 21B of the portion 21. In some embodiments, an angle between the sub-portion 21A and the sub-portion 21B of the portion 21 may be about 90°. In some embodiments, the sub-portion 21A includes the surface 211 and the surface 213, and the sub-portion 21B is connected to the substrate 10. In some embodiments, the sub-portion 21A and the sub-portion 21B of the portion 21 may be or include plates. In some embodiments, the sub-portion 21A serves to provide electrical connection to the electronic component 60. In some embodiments, a width of the sub-portion 21B is less than about 1 mm. In some embodiments, a width of the sub-portion 21B is less than about 0.4 mm.

According to some embodiments of the present disclosure, with the design of the sub-portion 21A, the surface 213 can provide a relatively large area for electrically connecting to the electronic component 60, and thus the design flexibility of the arrangement of the electronic component 60 is increased. In addition, according to some embodiments of the present disclosure, the size of the sub-portion 21B is less than a size of a conductive pins or post, which is normally greater than about 1 mm, and thus the device area of the substrate 10 occupied by the clip 20 is relatively small, thereby the device area reserved for electronic components 40 can be increased, resulting in an increase of substrate utilization.

Similarly, in some embodiments, the portion 22 includes a sub-portion 22A and a sub-portion 22B connected to the sub-portion 22A. In some embodiments, an angle between the sub-portion 22A and the sub-portion 22B of the portion 22 may be about 90°. In some embodiments, the sub-portion 22A includes the surface 221 and the surface 223, and the sub-portion 22B is connected to the substrate 10.

The conductive elements 51 are on the clip 20. In some embodiments, the conductive elements 51 are on the portions 21 and 22 of the clip 20. In some embodiments, the conductive elements 51 are on the surfaces 213 and 223 of the clip 20. In some embodiments, a projection of the conductive element 51 on the substrate 10 overlaps a projection of the electronic component 40 on the substrate 10. In some embodiments, the conductive element 51 may be or include a conductive material such as a metal or metal alloy. Examples include Au, Ag, Al, Cu, or an alloy thereof. In some embodiments, the conductive element 51 may be or include a soldering material.

The encapsulant 30 is disposed on the surface 102 of the substrate 10. The encapsulant 30 encapsulates the clip 20. In some embodiments, the encapsulant 30 encapsulates the electronic component 40. In some embodiments, the encapsulant 30 is filled in the slit 20S of the clip 20. In some embodiments, the encapsulant 30 includes an epoxy resin having fillers, a molding compound (e.g., an epoxy molding compound or other molding compound), polyimide, a phenolic compound or material, a material with a silicone dispersed therein, or a combination thereof. According to some embodiments of the present disclosure, the encapsulant 30 encapsulates the separated portions 21 and 22 of the clip 20, and thus the strength of the whole structure the clip 20 can be enhanced.

In some embodiments, the encapsulant 30 includes a portion 310 (also referred to as "a support structure") between the clip 20 and the substrate 10. In some embodiments, the portion 310 of the encapsulant 30 is disposed above the substrate 10 and supports the clip 20. In some embodiments, the portion 310 of the encapsulant 30 has a surface 301 and a surface 302 facing the surface 301, and the surface 301 and the surface 302 define a gap 30G. In some embodiments, the surface 301 of the portion 310 of the encapsulant 30 is substantially coplanar with the surface 211 of the portion 21 of the clip 20. In some embodiments, the surface 302 of the portion 310 of the encapsulant 30 is substantially coplanar with the surface 221 of the portion 22 of the clip 20. In some embodiments, the opening 31 has a surface 303 and a surface 304 facing the surface 303, and the surface 303 is substantially coplanar with the surface 301 of the gap 30G and the surface 211 of the portion 21 of the clip 20. In some embodiments, the surface 304 of the opening 31 is substantially coplanar with the surface 302 of the gap 30G and the surface 221 of the portion 22 of the clip 20.

In some embodiments, the encapsulant 30 has an opening 31 connected to the slit 20S of the clip 20. In some embodiments, the slit 20S of the clip 20 is within the opening 31 of the encapsulant 30. In some embodiments, the opening 31 extends into the space defined by the substrate 10 and the clip 20. In some embodiments, a portion (i.e., the gap 30G) of the opening 31 is between the slit 20S and the electronic component 40. In some embodiments, the opening 31 exposes the slit 20S. In some embodiments, the opening 31 exposes a surface 305 (also referred to as "an upper surface") of the encapsulant 30. In some embodiments, the surface 305 is below the surface 211 and the surface 212 of the portion 21 of the clip 20. In some embodiments, the slit 20S is sandwiched between portions of the opening 31. In some embodiments, the encapsulant 30 has an opening 32 exposing a portion of the clip 20. In some embodiments, the opening 32 exposes a portion of the surface 213 of the portion 21 of the clip 20. In some embodiments, the opening 32 exposes a portion of the surface 223 of the portion 22 of the clip 20. In some embodiments, the opening 32 of the encapsulant 30 exposes the conductive element 51 on the clip 20. According to some embodiments of the present disclosure, with the design of the encapsulant 30 having the opening 32, while the structural strength of the separated portions 21 and 22 of the clip 20 can be enhanced, the opening 32 exposes the region for the conductive element 51, which is further advantageous to the subsequent electrical connection to the electronic component 60. In addition, the opening 32 of the encapsulant 30 can define the region for forming the conductive element 51, which is particularly advantageous to defining and limiting a region for disposing a soldering material to form the conductive element 50.

The electronic component 40 is disposed on the surface 102 of the substrate 10. In some embodiments, the portion 310 (also referred to "the support structure") of the encapsulant 30 is disposed between the electronic component 40 and the surface 213 of the portion 21 of the clip 20. In some embodiments, the electronic component 40 is disposed between the substrate 10 and the portion 310 of the encapsulant 30. In some embodiments, the portion 310 of the encapsulant 30 encapsulates the clip 20 and exposes the surface 211 of the portion 21 of the clip 20. In some embodiments, the portion 310 of the encapsulant 30 encapsulates the clip 20 and exposes the surface 221 of the portion 22 of the clip 20. The portion 310 of the encapsulant 30 may serve to support the portions 21 and 22 of the clip 20 from deformation of collapse. In some embodiments, the electronic component 40 is electrically connected to the substrate 10 (e.g., the conductive pads 117) through one or more bonding wires. In some embodiments, the encapsulant 30 encapsulates the bonding wire. In some embodiments, a projection of the conductive element 51 on the substrate 10 overlaps a projection of the bonding wire on the substrate 10. In some embodiments, the electronic component 40 is adhered to the substrate 10 through an adhesive layer (for example, a die attach film (DAF)). In other embodiments, the electronic component 40 may be electrically connected to the substrate 10 through flip-chip or any other suitable techniques. In some embodiments, the electronic component 40 is spaced apart from the clip 20 by the encapsulant 30. In some embodiments, the portions 21 and 22 of the clip 20 are above the electronic component 40. In some embodiments, the slit 20S of the clip 20 is directly above the electronic component 40. In some embodiments, the electronic component 40 may be or include an active component, such as an integrated circuit (IC) chip or a die. In some embodiments, the electronic component 40 may be or include a passive electrical component, such as a capacitor, a resistor or an inductor. In some embodiments, there may be any number of electronic components 40 disposed on the substrate 10 depending on different specifications. In some embodiments, the electronic component 40 may be disposed on the surface 102 of the substrate 10 or embedded within the substrate 10.

The electronic component 60 is disposed on the clip 20. The electronic component 60 is connected to the clip 20. The electronic component 60 is electrically connected to the substrate 10 through the clip 20. In some embodiments, the electronic component 60 is connected to the portions 21 and 22 of the clip 20. In some embodiments, the electronic component 60 is crossing the portions 21 and 22 of the clip 20. In some embodiments, the electronic component 60 includes two terminals respectively electrically connected to the portion 21 and the portion 22 of the clip 20. In some embodiments, the electronic component 60 is connected to the clip 20 through the conductive element 51. In some embodiments, the electronic component 60 may be or include an active component, such as an IC chip or a die. In some embodiments, the electronic component 60 may be or include a passive electrical component, such as a capacitor, a resistor, an inductor or a crystal resonator. In some embodiments, the electronic component 60 may include more than two terminals electrically connected to the corresponding portions of the clip 20 which are separated from each other. In some embodiments, the number of the separate portions of the clip 20 is equal to or greater than the number of the terminals of the electronic component 60.

In some embodiments, the electrical connection between the electronic component 60 and the substrate 10 may be achieved by conductive pillars (e.g., Cu pillars). For example, the conductive pillars are disposed on the surface 102 of the substrate 10 to electrically connect the electronic component 60 with the substrate 10. However, an aspect ratio (e.g., a ratio of the height to the width/diameter) of each conductive pillar should be greater than a predetermined value to avoid the tilt issue of the conductive pillar. In other words, as the height of the conductive pillar increases, the area of the conductive pillar would increase as well. This would hinder the miniaturization of the semiconductor device package and reduce the flexibility for the arrangement of the components on the substrate 10.

In accordance with the embodiments as shown in FIG. 1, the electrical connection between the electronic component 60 and the substrate 10 is achieved by the clip 20. The design of the clip 20 allows the clip 20 (e.g., the sub-portion 21B and the sub-portion 22B) to connect to various positions of the substrate 10 depending on different specifications, regardless of the relative position of the electronic component 60. Therefore, the area required for electrical connection between the electronic component 60 and the substrate 10 is reduced, which is advantageous to miniaturization of the semiconductor device package. In addition, with the clip 20 configured to be available to connect to various positions of the substrate 10, the flexibility for the arrangement of the components on the substrate 10 can be increased as well.

Figure 1A:
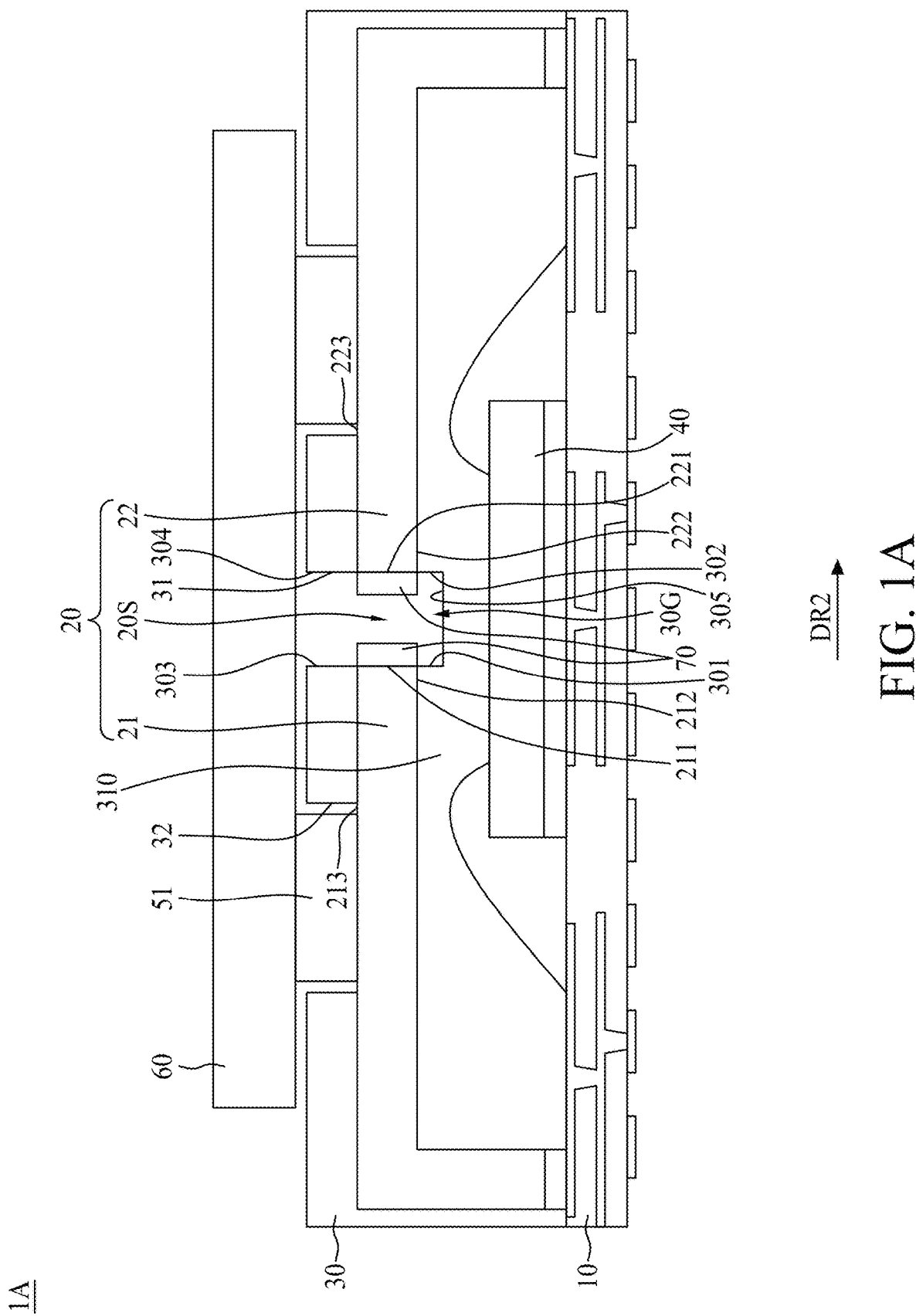
FIG. 1A illustrates a cross-sectional view of a semiconductor device package in accordance with some embodiments of the present disclosure.

FIG. 1A illustrates a cross-sectional view of a semiconductor device package 1A in accordance with some embodiments of the present disclosure. The semiconductor device package 1A is similar to the semiconductor device package 1 in FIG. 1 except that, for example, the semiconductor device package 1A further includes a protective layer 70.

In some embodiments, the protective layer 70 is disposed on the surface 211 of the portion 21 of the clip 20. In some embodiments, the protective layer 70 covers the surface 211 of the portion 21 of the clip 20. In some embodiments, the protective layer 70 is disposed on the surface 221 of the portion 22 of the clip 20. In some embodiments, the protective layer 70 covers the surface 221 of the portion 22 of the clip 20.

In some embodiments, the protective layer 70 may include portions respectively on the surface 211 and the surface 221, and these portions are spaced apart from each other, as illustrated in FIG. 1A. In some other embodiments, the protective layer 70 may include a monolithic structure filled in the slit 20S and contacting the surfaces 211 and 221 of the clip 20. In some embodiments, the protective layer 70 includes a plated material. In some embodiments, the protective layer 70 includes a tin (Sn)-containing plated material. In some embodiments, the protective layer 70 includes a dielectric material. The protective layer 70 can prevent oxidation of the surfaces 211 and 221 of the portions 21 and 22 of the clip 20.

Figure 2A:
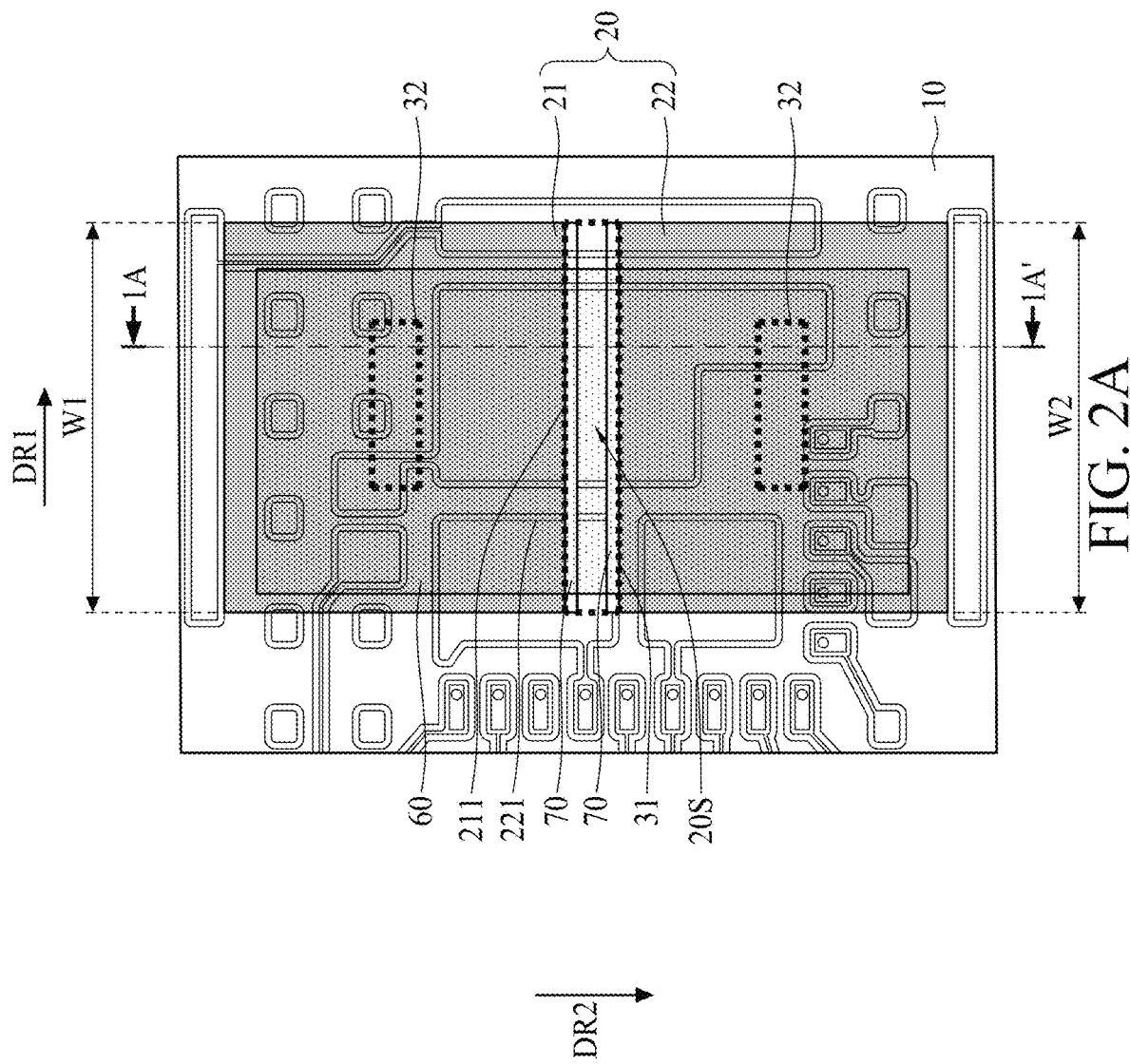
FIG. 2A illustrates a top view of a semiconductor device package in accordance with some embodiments of the present disclosure.

FIG. 2A illustrates a top view of a semiconductor device package 1A in accordance with some embodiments of the present disclosure. In some embodiments, FIG. 1A illustrates a cross-sectional view along the cross-sectional line 1A-1A' in FIG. 2A. It should be noted that some components are omitted for clarity. For example, the encapsulant 30 is omitted in FIG. 2A, and only the arrangements of the openings 31 and 32 of the encapsulant 30 are indicated in FIG. 2A.

In some embodiments, a width W1 of the portion 21 of the clip 20 is substantially the same as a width W2 of the portion 22 of the clip 20. In some embodiments, the width W1 and the width W2 extend along substantially the same direction (i.e., the direction DR1). In some embodiments, the width W1, the width W2 and the slit 20S of the clip 20 extend along substantially the same direction (i.e., the direction DR1). In some embodiments, the slit 20S between the portion 21 and the portion 22 has a substantially consistent width. In some embodiments, the slit 20S between the portion 21 and the portion 22 has a substantially consistent width along a direction (i.e., the direction DR1) substantially in parallel with the surface 301 of the portion 310 of the encapsulant 30. In some embodiments, the slit 20S of the clip 20 is within the opening 31 of the encapsulant 30. In some embodiments, the opening 31 of the encapsulant 30 aligns with the slit 20S of the clip 20 from a top view perspective. In some embodiments, the openings 32 are located in regions where the clip 20 and the electronic component 60 overlap from a top view perspective. In some embodiments, the openings 32 are located in a region where the portion 21 of the clip 20 overlaps the electronic component 60 and a region where the portion 22 of the clip 20 overlaps the electronic component 60. In some embodiments, the shape, the area, and the number of the opening(s) 32 of the encapsulant 30 may vary depending on different specifications.

In some embodiments, a width (e.g., the width W1) of the surface 211 of the portion 21 of the clip 20 is substantially the same as a width (e.g., the width W2) of the surface 221 of the portion 22 of the clip 20. In some embodiments, the surface 211 of the portion 21 of the clip 20 is conformal with the surface 221 of the portion 22 of the clip 20. In some embodiments, an area of the surface 211 of the portion 21 of the clip 20 is substantially the same as an area of the surface 221 of the portion 22 of the clip 20. In some embodiments, a length of the protective layer 70 is substantially the same as a width (e.g., the width W1) of the surface 211 of the portion 21 of the clip 20. In some embodiments, a length of the protective layer 70 is substantially the same as a width (e.g., the width W2) of the surface 221 of the portion 22 of the clip 20.

In some embodiments, the electronic component 60 may be an inductor, and the portions 21 and 22 are respectively connected to two terminals of the electronic component 60.

Figure 2B:
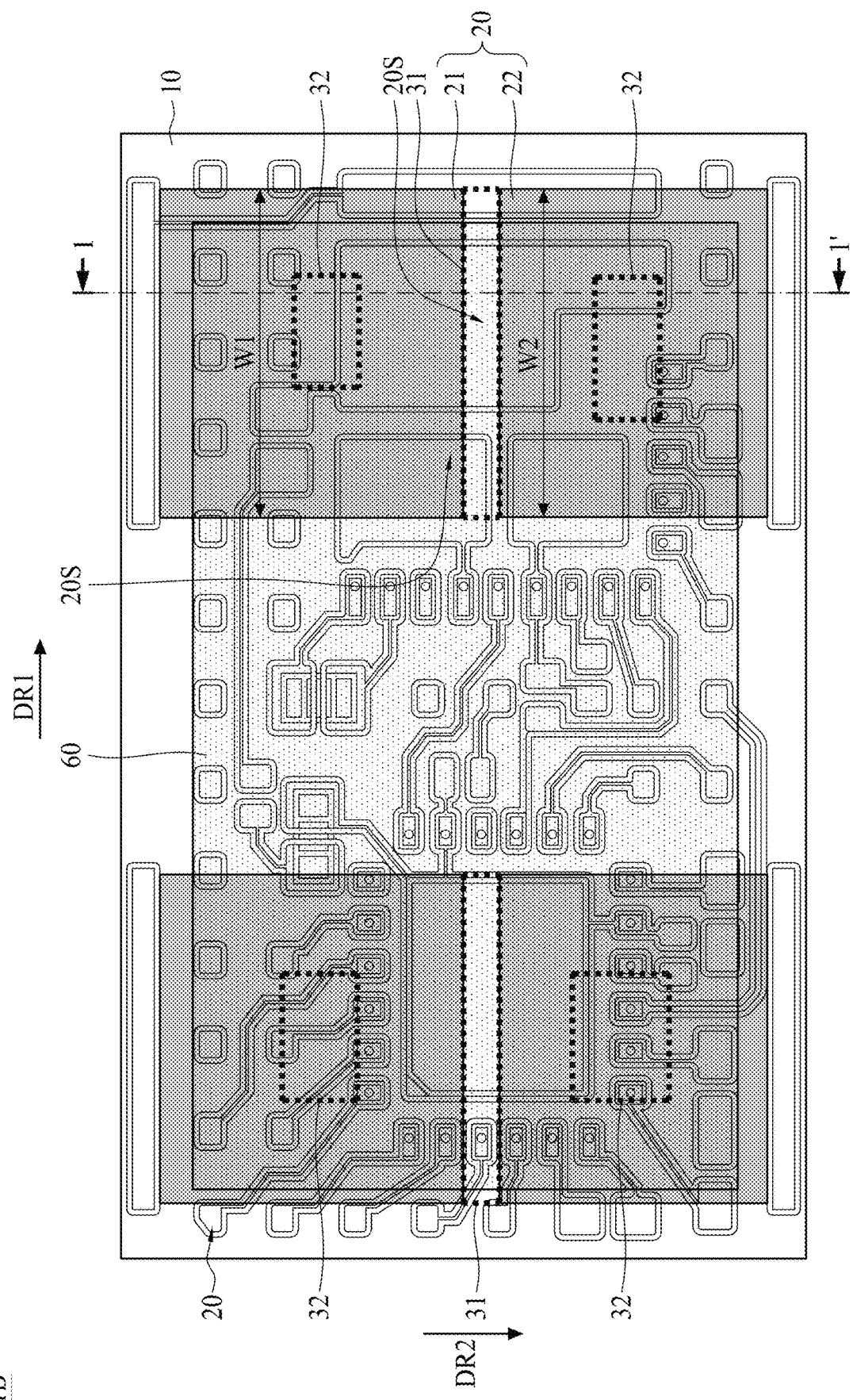
FIG. 2B illustrates a top view of a semiconductor device package in accordance with some embodiments of the present disclosure.

FIG. 2B illustrates a top view of a semiconductor device package 1B in accordance with some embodiments of the present disclosure. In some embodiments, FIG. 2B illustrates a cross-sectional view along the cross-sectional line 1-1' in FIG. 1. It should be noted that some components are omitted for clarity. For example, the encapsulant 30 is omitted in FIG. 2B, and only the arrangements of the openings 31 and 32 of the encapsulant 30 are indicated in FIG. 2B.

In some embodiments, the semiconductor device package 1B includes two clips 20 and one electronic component 60. In some embodiments, the electronic component 60 is connected to the portions 21 and the portions 22 of the clips 20. In some embodiments, the electronic component 60 is connected to the portions 21 and the portions 22 of the clips 20 through the conductive elements 51 exposed from the openings 32 of the encapsulant 30.

In some embodiments, the electronic component 60 may be a crystal resonator, and the portions 21 and 22 of the two clips 20 are respectively connected to four terminals of the electronic component 60.

Figure 3:
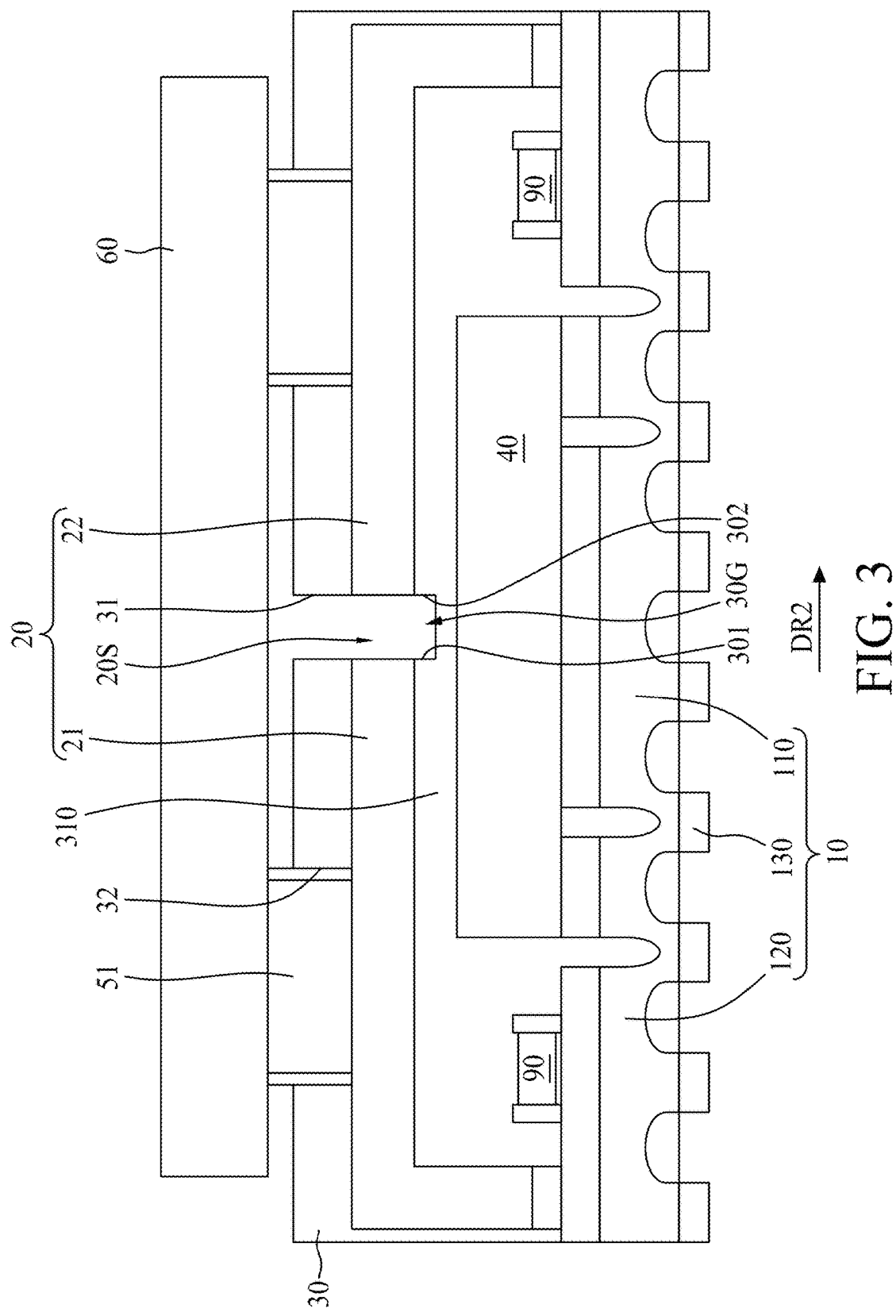
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 2 is similar to the semiconductor device package 1 in FIG. 1, and some of the differences therebetween are described below.

In some embodiments, the substrate 10 of the semiconductor device package 2 may be or include a leadframe. In some embodiments, the substrate 10 includes a paddle 110, leads 120, and conductive layers 130. In some embodiments, the conductive layers 130 are disposed on bottom surfaces of the paddle 110 and the leads 120 for electrical connections. In some embodiments, the conductive layers 130 include tin (Sn) layers. In some embodiments, the electronic component 40 is disposed on the paddle 110. In some embodiments, the semiconductor device package 2 further includes electronic components 90 on the leads 120. In some embodiments, the electronic components 90 may be or include surface mount devices (SMDs).

Figure 4:
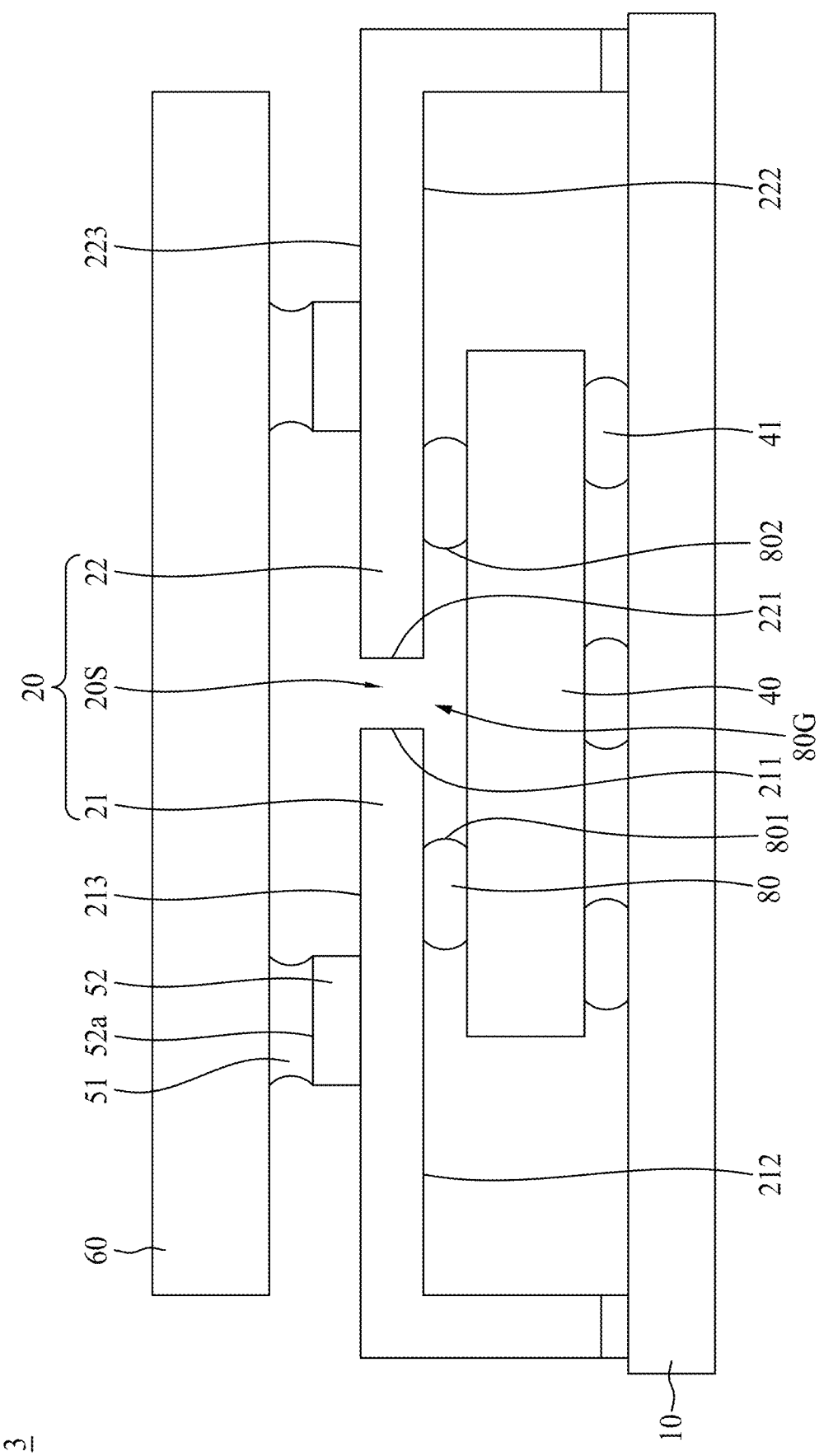
FIG. 4 illustrates a cross-sectional view of a semiconductor device package in accordance with some embodiments of the present disclosure.

FIG. 4 illustrates a cross-sectional view of a semiconductor device package 3 in accordance with some embodiments of the present disclosure. The semiconductor device package 3 is similar to the semiconductor device package 1 in FIG. 1, and some of the differences therebetween are described below.

In some embodiments, the surface 213 of the portion 21 of the clip 20 of the semiconductor device package 3 is exposed to a gap between the clip 20 and the electronic component 60, and a surface roughness of the surface 211 is greater than a surface roughness of the surface 213 of the portion 21 of the clip 20. In some embodiments, the surface 223 of the portion 22 of the clip 20 is exposed to a gap between the clip 20 and the electronic component 60, and a surface roughness of the surface 221 is greater than a surface roughness of the surface 223 of the portion 22 of the clip 20.

In some embodiments, the electronic component 60 is connected to the clip 20 through conductive elements 51 and 52. In some embodiments, the conductive elements 51 and 52 are on the surface 213 of the portion 21 of the clip 20. In some embodiments, the conductive elements 51 and 52 are on the surface 223 of the portion 22 of the clip 20. In some embodiments, the conductive element 52 is on the clip, and the conductive element 51 is on a surface 52a of the conductive element 52. In some embodiments, the conductive element 51 is spaced apart from the clip 20. In some embodiments, a size of the conductive element 51 is defined by the surface 52a of the conductive element 52. In some embodiments, the conductive element 52 may be or include a conductive material such as a metal or metal alloy. Examples include Au, Ag, Al, Cu, or an alloy thereof. In some embodiments, the conductive element 51 includes a soldering material, and the conductive element 52 includes a solderless conductive material. According to some embodiments of the present disclosure, with the design of the conductive element 52, the soldering material of the conductive element 51 can be defined and limited within the region of the surface 52a of the conductive element 52, and thus the encapsulant 30 and the manufacturing process thereof can be omitted. Accordingly, the manufacturing process is simplified, and the cost is reduced as well.

The semiconductor device package 3 may further include one or more conductive elements 41. In some embodiments, the conductive elements 41 connect the electronic component 40 to the substrate 10. In some embodiments, the electronic component 40 is electrically connected to the substrate 10 through the conductive elements 41. In some embodiments, the conductive element 41 may be or include a conductive material such as a metal or metal alloy. Examples include Au, Ag, Al, Cu, or an alloy thereof.

The semiconductor device package 3 may further include a support structure 80 (also referred to as "a buffer structure"). In some embodiments, the support structure 80 is disposed between the clip 20 and the substrate 10. In some embodiments, the support structure 80 is disposed between the electronic component 40 and the clip 20. In some embodiments, the support structure 80 is disposed between the electronic component 40 and the surface 213 of the portion 21 of the clip 20. In some embodiments, the support structure 80 is disposed between the electronic component 40 and the surface 223 of the portion 22 of the clip 20. In some embodiments, the support structure 80 directly contacts the electronic component 40 and the clip 20. In some embodiments, the electronic component 40 is spaced apart from the clip 20 by the support structure 80.

In some embodiments, the support structure 80 has a surface 801 and a surface 802 facing the surface 801, and the surface 801 and the surface 802 define a gap 80G. In some embodiments, the surface 801 of the support structure 80 is between the electronic component 40 and the surface 212 of the portion 21 of the clip 20. In some embodiments, the surface 802 of the support structure 80 is between the electronic component 40 and the surface 222 of the portion 22 of the clip 20.

According to some embodiments of the present disclosure, the semiconductor device package 3 is free from an encapsulant 30, and the support structure 80 can serve to support the portions 21 and 22 of the clip 20 from deformation or collapse. Therefore, the reliability of the semiconductor device package 3 can be improved.

Figure 5B:
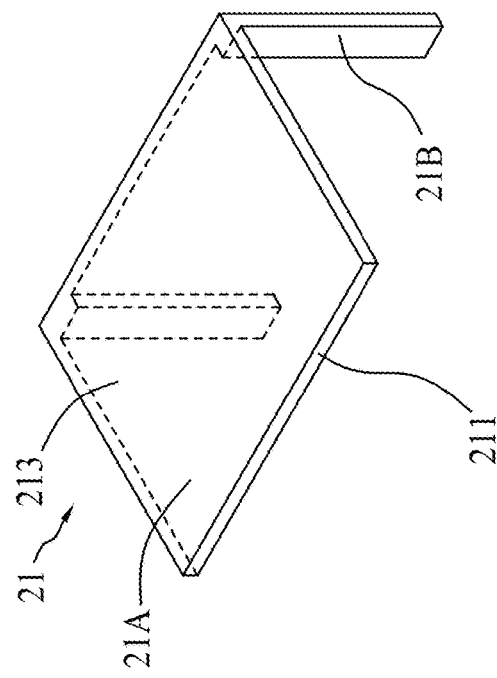
FIG. 5B illustrates a perspective view of a portion of a clip in accordance with some embodiments of the present disclosure.
Figure 5A:
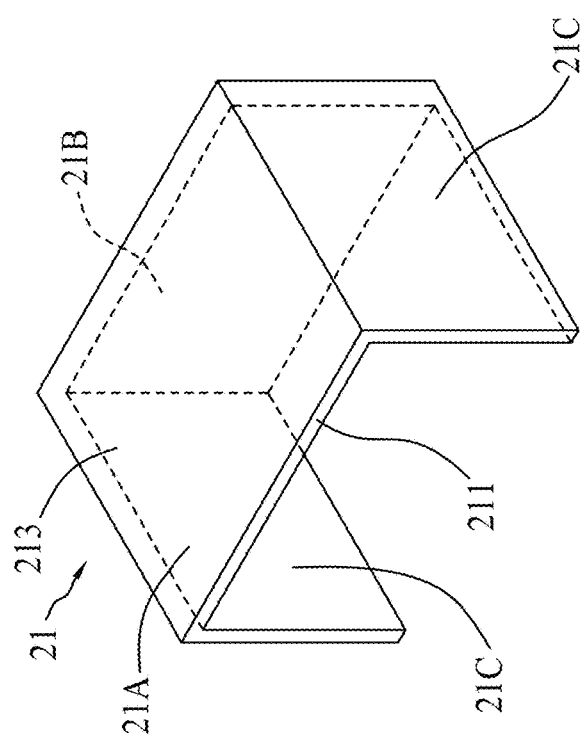
FIG. 5A illustrates a perspective view of a portion of a clip in accordance with some embodiments of the present disclosure.

FIG. 5A illustrates a perspective view of a portion 21 of a clip 20 in accordance with some embodiments of the present disclosure.

In some embodiments, the portion 21 of the clip 20 further includes parts 21C connected to the sub-portion 21A and the sub-portion 21B. In some embodiments, the parts 21A, 21B and 21C of the portion 21 may be or include plates. Similarly, in some embodiments, the portion 22 of the clip 20 may include a structure similar to that shown in FIG. 5A.

FIG. 5B illustrates a perspective view of a portion 21 of a clip 20 in accordance with some embodiments of the present disclosure.

In some embodiments, the sub-portion 21B of the portion 21 of the clip 20 includes rods connected to the sub-portion 21A. In some embodiments, the rods of the sub-portion 21B are spaced apart from each other. In some embodiments, the sub-portion 21A may be or include plates. Similarly, in some embodiments, the portion 22 of the clip 20 may include a structure similar to that shown in FIG. 5B.

Figure 5C:
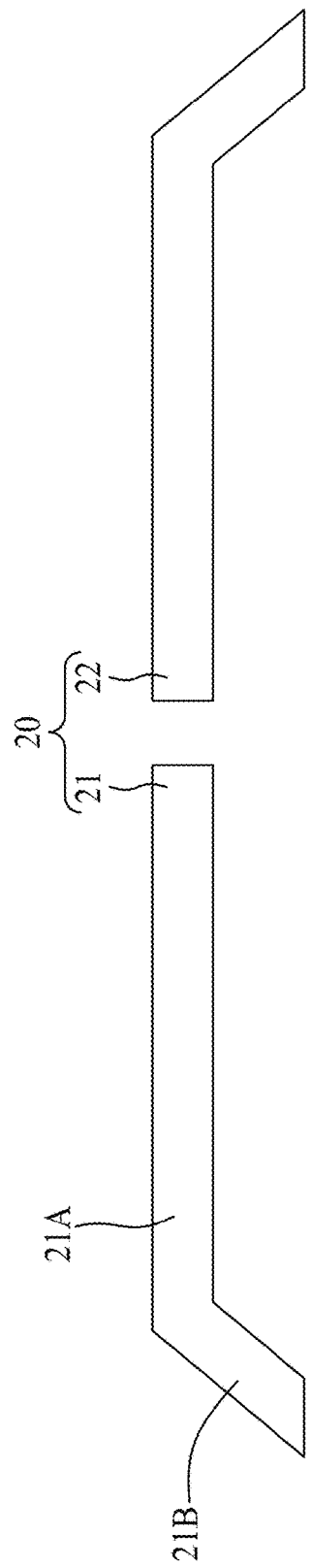
FIG. 5C illustrates a cross-sectional view of a clip in accordance with some embodiments of the present disclosure.

FIG. 5C illustrates a cross-sectional view of a clip 20 in accordance with some embodiments of the present disclosure.

In some embodiments, an angle between the sub-portion 21A and the sub-portion 21B of the portion 21 may be greater than about 90°. Similarly, in some embodiments, an angle between the sub-portion 22A and the sub-portion 22B of the portion 22 may be greater than about 90° (not shown in FIG. 5C).

FIG. 6A, FIG. 6B, FIG. 6C, FIG. 6D, FIG. 6E, and FIG. 6F illustrate various operations in a method of manufacturing a semiconductor device package 1A in accordance with some embodiments of the present disclosure.

Figure 6A:
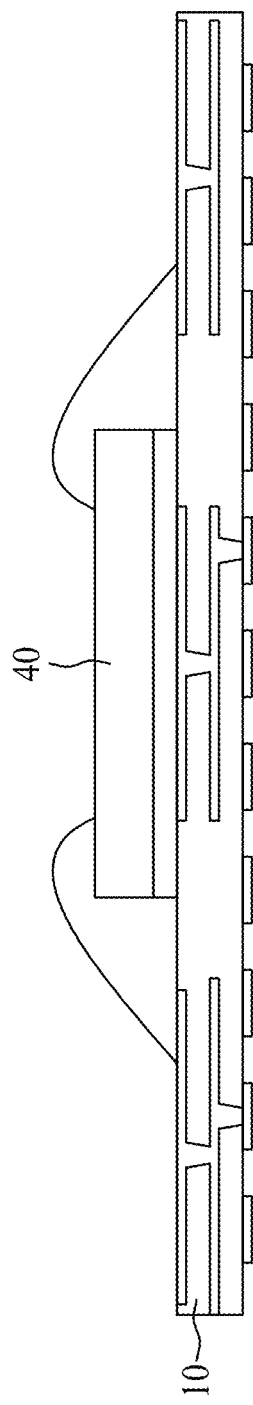

Referring to FIG. 6A, a substrate 10 is provided, and an electronic component 40 is disposed on the substrate 10. In some embodiments, the electronic component 40 is adhered to the substrate 10 through an adhesive layer. In some embodiments, the electronic component 40 is electrically connected to the substrate 10 through bonding wires.

Figure 6B:
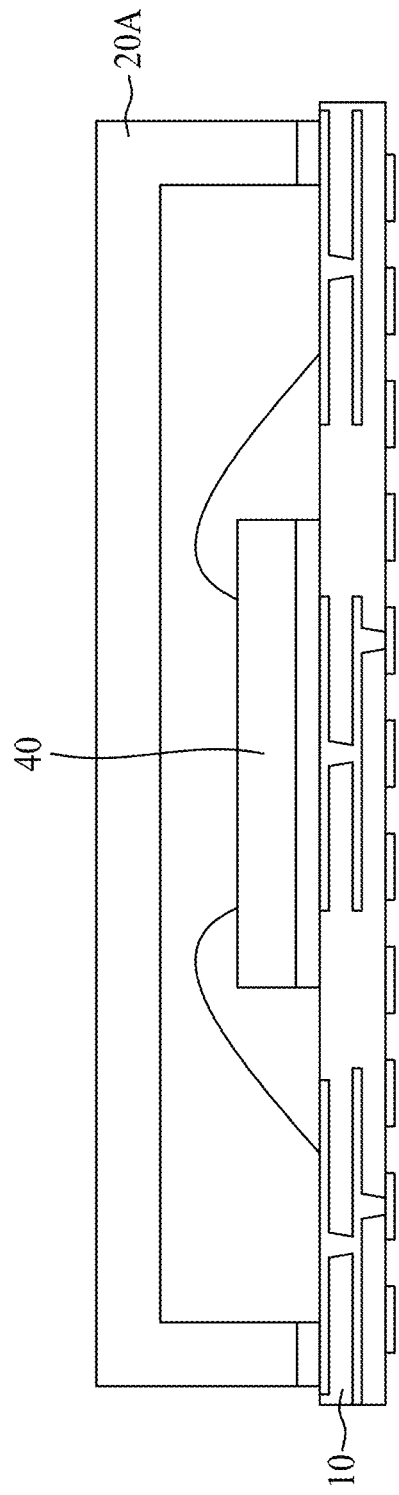

Referring to FIG. 6B, an integrated clip 20A is bonded to the substrate 10. In some embodiments, the integrated clip 20A includes a monolithic structure. In some embodiments, the integrated clip 20A is formed integrally as a monolithic structure.

Figure 6C:
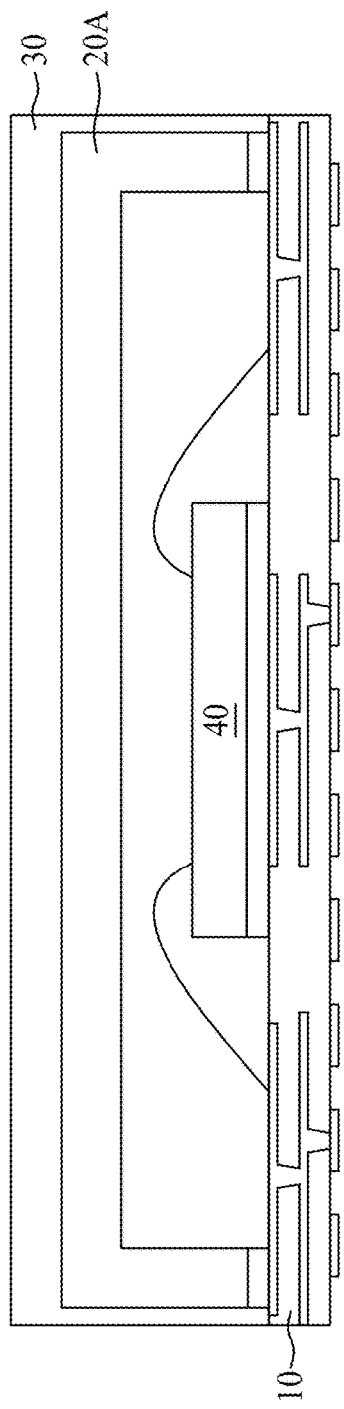

Referring to FIG. 6C, the integrated clip 20A is encapsulated with an encapsulant 30. In some embodiments, the electronic component 40 is encapsulated with the encapsulant 30. In some embodiments, a portion 310 of the encapsulant 30 is between the electronic component 40 and the integrated clip 20A. In some embodiments, an encapsulant material may be applied on the substrate 10 and encapsulating the integrated clip 20A and the electronic component 40.

Figure 6D:
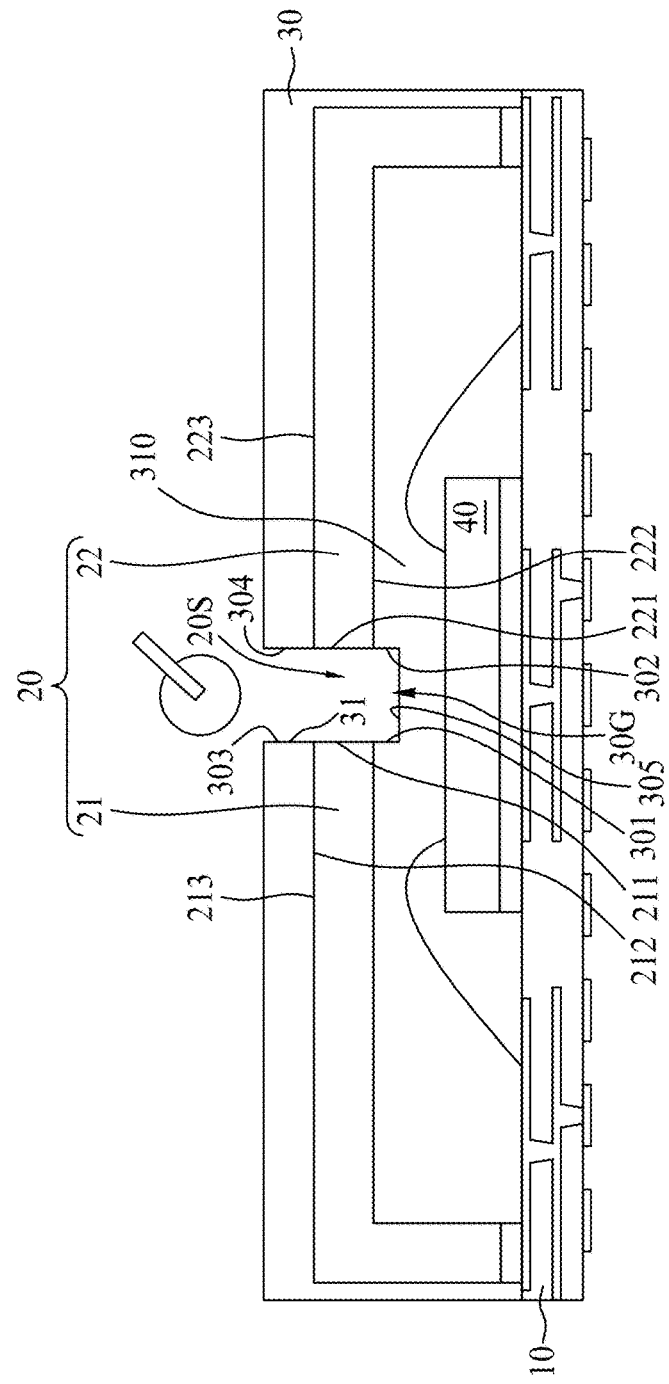

Referring to FIG. 6D, the integrated chip 20A is separated into a portion 21 and a portion 22, so as to form a clip 20 including the portions 21 and 22. In some embodiments, a portion of the integrated clip 20A may be removed to separate the portion 21 and the portion 22 from each other. In some embodiments, a portion of the integrated clip 20A may be removed to electrically isolate the portion 21 and the portion 22. In some embodiments, the integrated chip 20A may be separated by cutting through the integrated chip 20A to divide the monolithic structure of the integrated chip 20A into separated portions 21 and 22. In some embodiments, the integrated clip 20A is encapsulated with the encapsulant 30 prior to separating the integrated chip 20A.

In some embodiments, separating the integrated chip 20A may include removing a portion of the integrated clip 20A to form a slit 20S separating the integrated chip 20A into the portion 21 and the portion 21.

In some embodiments, a portion of the encapsulant 30 may be removed to expose the slit 20S. In some embodiments, a portion of the encapsulant 30 may be removed to form an opening 31 exposing the slit 20S. In some embodiments, the portion of the encapsulant 30 may be removed to form the opening 31 including a gap 30G below the slit 20S. In some embodiments, the gap 30G may be defined by a surface 301 and a surface 302 of the portion 310 of the encapsulant 30. In some embodiments, the portion of the encapsulant 30 may be removed by cutting through the portion of the encapsulant 30 to form the opening 31. In some embodiments, removing the portion of the integrated clip 20A and removing the portion of the encapsulant 30 may be performed in the same operation.

Referring to FIG. 6E, a protective layer 70 may be formed on the surface 211 of the portion 21 and the surface 221 of the portion 22. In some embodiments, the protective layer 70 may be formed by plating, for example, plating a Sn-containing layer on the surfaces 211 and 221. In some embodiments, the protective layer 70 may be formed by deposition, for example, depositing a dielectric material on the surfaces 211 and 221.

Referring to FIG. 6F, forming one or more openings 32 in the encapsulant 30 for expose a portion of the clip 20. In some embodiments, the openings 32 may be formed by laser ablation.

Next, referring to FIG. 1A, conductive elements 51 are formed on the clip 20 within the openings 32 of the encapsulant 30, and an electronic component 60 is disposed over the clip 20. In some embodiments, the electronic component 60 is connected to the clip 20 through solder joint technique, for example, surface mount technique (SMT). In some embodiments, the conductive elements 51 may include soldering materials, and the electronic component 60 is bonded to the clip 20 through the conductive elements 51. As such, the semiconductor device package 1A illustrated in FIG. 1A is formed.

FIG. 7A, FIG. 7A1, FIG. 7A2 and FIG. 7B illustrate various operations in a method of manufacturing a semiconductor device package 1A in accordance with some embodiments of the present disclosure.

Operations similar to those illustrated in FIGS. 6A-6F are formed, except that a plurality of electronic components 40 are disposed on a substrate 10, the electronic components 40 are encapsulated by an encapsulant 30, and a plurality of clips 20 are formed over the plurality of electronic components 40. Next, referring to FIG. 7A, a singulation operation is performed on the substrate 10 and the encapsulant 30. For example, the singulation operation may include cutting through the substrate 10 and the encapsulant 30 along the cutting line S.

Figure 7A:
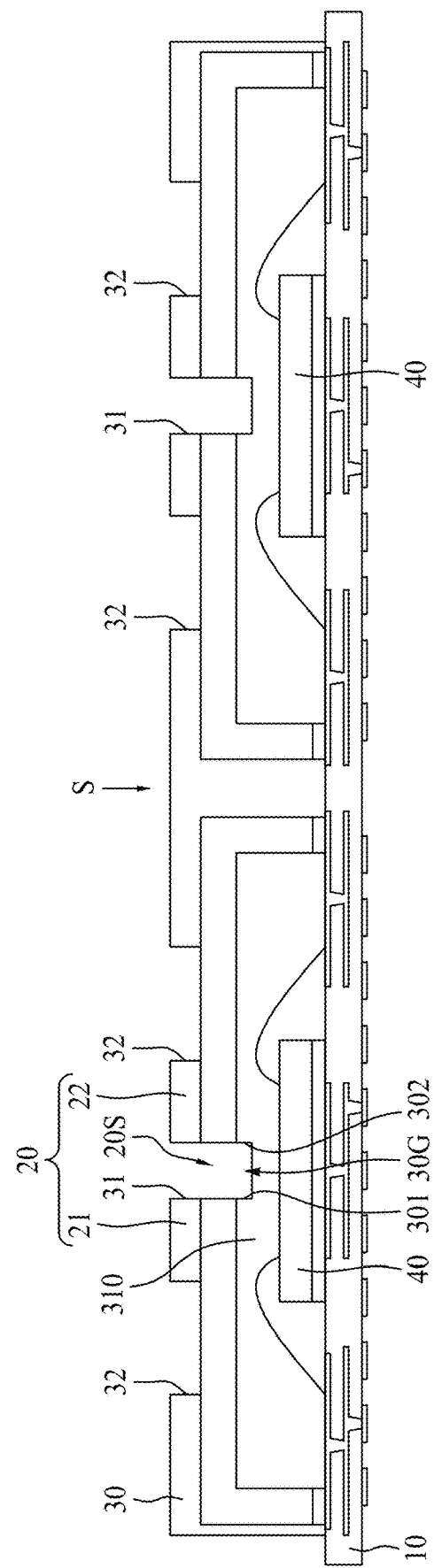

FIG. 7A1 illustrates a top view of the operation(s) illustrated in FIG. 7A in accordance with some embodiments of the present disclosure, and FIG. 7A2 illustrates an enlarged top view of the structure shown in the dashed box 7A2 in FIG. 7A1. Referring to FIGS. 7A1 and 7A2, the singulation operation performed on the substrate 10 and the encapsulant 30 may include cutting through the substrate 10 and the encapsulant 30 along the cutting lines S to form a plurality of singulated structures, as illustrated in FIG. 7A2.

Referring to FIG. 7B, the singulated structures each including a singulated encapsulant 30 and a clip 20 are disposed on a carrier 720 through an adhesive layer 710. In some embodiments, the adhesive layer 710 may be or include a tape. In some embodiments, the distances between the singulated structures are increased after disposed on the carrier 720. The increased distances between the singulated structures is advantageous to performing subsequent operations on the singulated structures.

Next, referring to FIG. 1, an electronic component 60 is disposed over the portion 21 and the portion 22 of the clip 20. In some embodiments, the electronic component 60 may be disposed over the clip 20 after performing the singulation operation. In some embodiments, the electronic component 60 is bonded to the clip 20 through the conductive elements 51. In some embodiments, the adhesive layer 710 (or the tape) may be separated to obtain separated singulated structures. As such, the semiconductor device package 1A illustrated in FIG. 1A is formed.

FIG. 8A, FIG. 8A1, FIG. 8B and FIG. 8C illustrate various operations in a method of manufacturing a semiconductor device package 3 in accordance with some embodiments of the present disclosure.

Referring to FIG. 8A, a substrate 10 is provided, an electronic component 40 is disposed on the substrate 10, a support structure 80 is disposed on the electronic component 40, and an integrated clip 20A is bonded to the substrate 10. In some embodiments, a surface 801 of the support structure 80 and a surface 802 of the support structure 80 define a gap 80G. In some embodiments, disposing the support structure 80 on the electronic component 40 is prior to bonding the integrated clip 20A to the substrate 10. In some embodiments, after the integrated clip 20A is bonded to the substrate 10, the integrated clip 20A directly contacts the support structure 80.

FIG. 8A1 illustrates a perspective view of the operation(s) illustrated in FIG. 8A in accordance with some embodiments of the present disclosure. It should be noted that some components are omitted in FIG. 8A1 for clarity. For example, the electronic component 40 and the support structure 80 are omitted. Referring to FIG. 8A1, the integrated clip 20A includes a portion 21, a portion 22 spaced apart from the portion 21, and a connecting mechanism 23 connecting the portion 21 and the portion 22. In some embodiments, the connecting mechanism 23 may be or include a removable connecting device for mechanically connecting the portion 21 and the portion 22. In some embodiments, the connecting mechanism 23 may be or include a jig, a clamp, a chuck, a clipper, or the like.

Figure 8B:
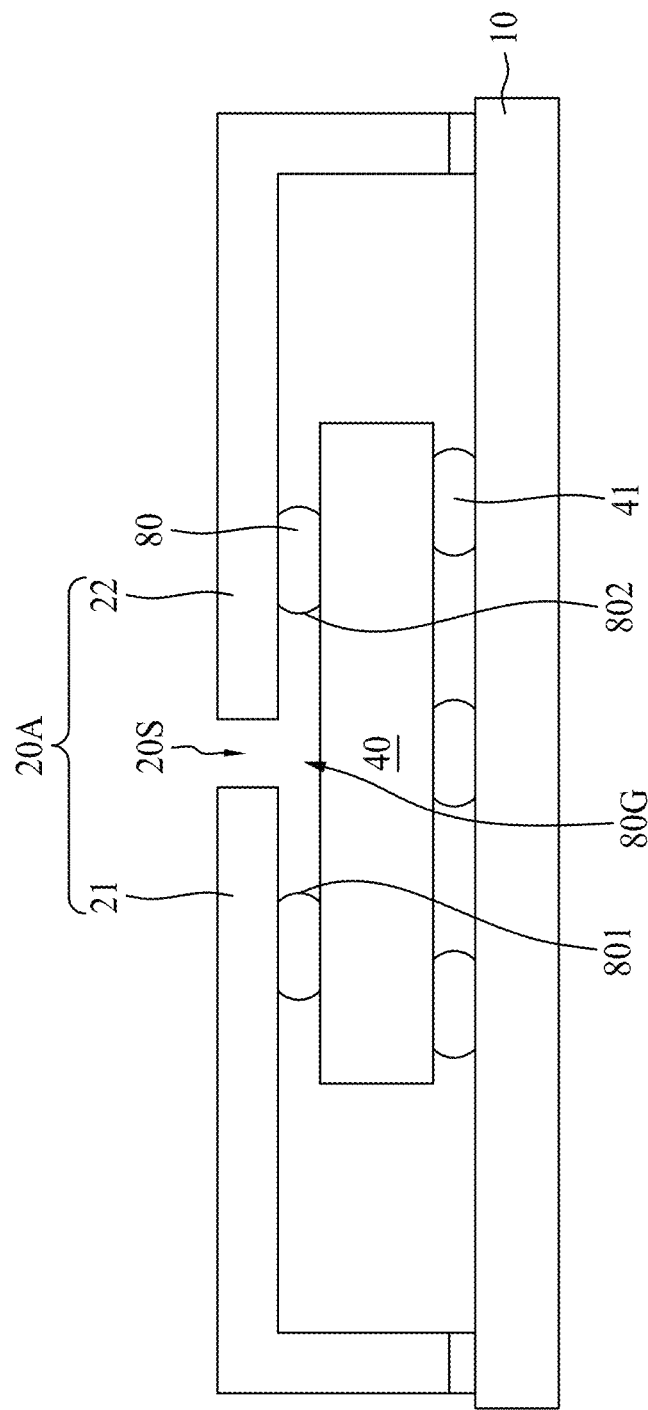

Referring to FIG. 8B, the integrated chip 20S is separated into the portion 21 and the portion 22. In some embodiments, separating the integrated chip 20S may include removing the connecting mechanism 23 from the portion 21 and the portion 22.

Figure 8C:
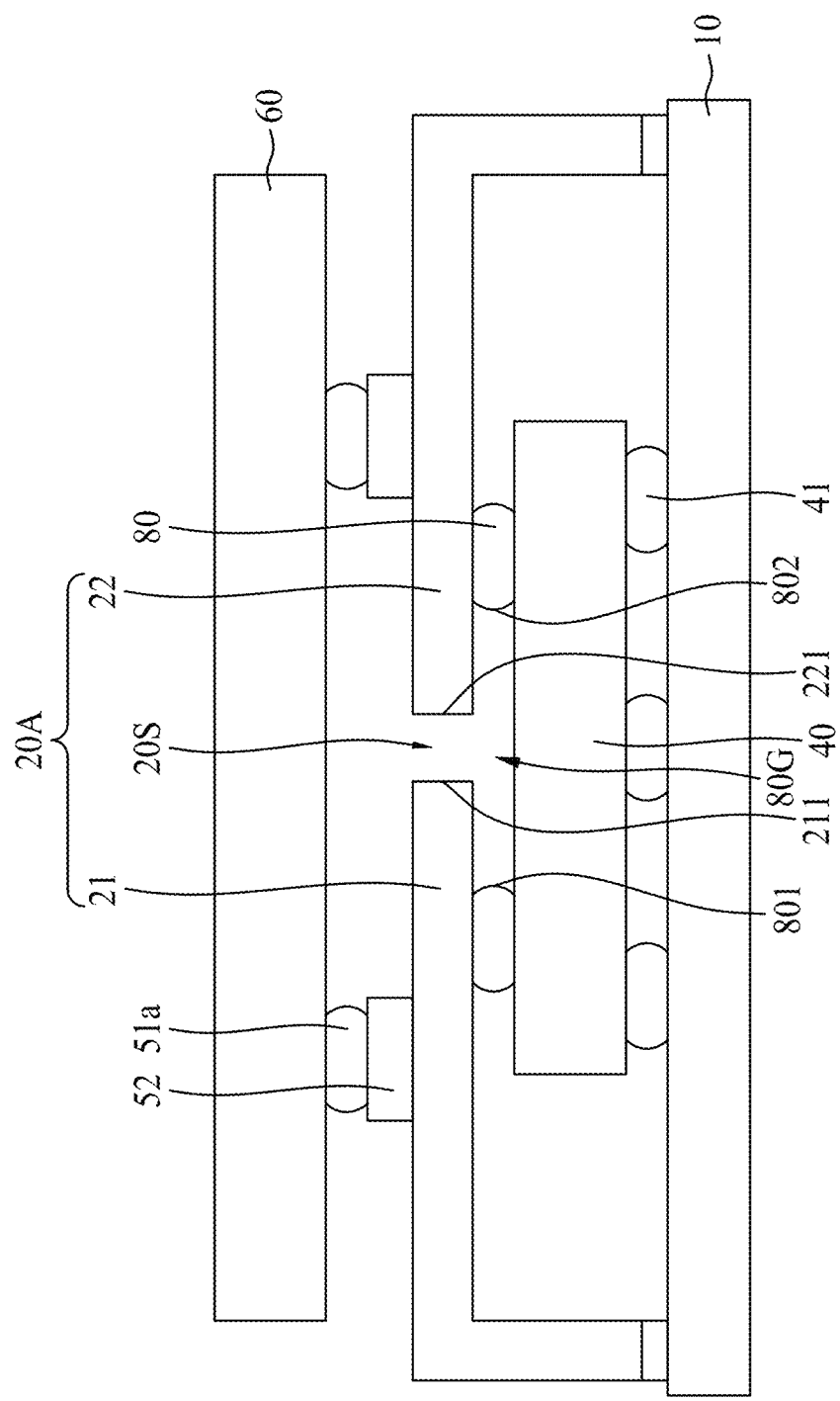

Referring to FIG. 8C, the electronic component 60 is connected to the clip 20. In some embodiments, the connecting mechanism 23 may be removed prior to or after the electronic component 60 is connected to the clip 20. In some embodiments, the conductive element 52 is formed on the clip 20, and the conductive element 51a is formed on the conductive element 52. In some embodiments, the conductive element 52 may include a solderless conductive material, and the conductive element 52 may be formed by plating. In some embodiments, the conductive element 51a may include a soldering material. In some embodiments, the electronic component 60 is disposed on the soldering material (i.e., the conductive element 51a), and then a reflow operation is performed on the soldering material (i.e., the conductive element 51a) to form a solder joint between the electronic component 60 and the conductive element 52. As such, the semiconductor device package 3 illustrated in FIG. 4 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate;
   a clip disposed on the substrate, the clip comprising a first portion and a second portion separated from each other by a slit; and
   a support structure disposed above the substrate and supporting the clip, wherein the support structure has a first surface and a second surface facing the first surface, and the first surface and the second surface define a gap;
   wherein the support structure at least partially encapsulates the clip, and the support structure has a first opening exposing the slit of the clip.

2. The semiconductor device package of claim 1, wherein the slit of the clip is within the first opening of the support structure.

3. The semiconductor device package of claim 1, wherein the first opening of the support structure aligns with the slit of the clip from a top view perspective.

4. The semiconductor device package of claim 3, wherein the first portion of the clip has a first surface facing the slit, the first opening of the support structure has a surface above the slit, and the first surface of the first portion of the clip, the surface of the first opening, and the first surface of the gap are substantially coplanar.

5. The semiconductor device package of claim 1, further comprising:
   a first electronic component disposed between the substrate and the support structure.

6. The semiconductor device package of claim 1, wherein the support structure has a second opening exposing a conductive element on the clip.

7. The semiconductor device package of claim 6, further comprising:
   a second electronic component connected to the clip through the conductive element.

8. The semiconductor device package of claim 1, further comprising:
   a first electronic component disposed on the substrate, wherein a portion of the support structure is disposed between the first electronic component and the clip.

9. The semiconductor device package of claim 8, further comprising
   a second electronic component disposed on the clip and crossing the first portion and the second portion.

10. The semiconductor device package of claim 1, wherein a first surface of the first portion of the clip and a second surface of the second portion of the clip define the slit, and the first surface is conformal with the second surface.

11. The semiconductor device package of claim 1, wherein the slit between the first portion and the second portion has a substantially consistent width.

12. The semiconductor device package of claim 11, wherein the slit has the consistent width along a direction substantially in parallel with the first surface of the support structure.

13. The semiconductor device package of claim 1, wherein a width of a first surface of the first portion of the clip is substantially the same as a width of a second surface of the second portion of the clip.

14. The semiconductor device package of claim 13, further comprising:
a protective layer covering the first surface of the first portion of the clip and the second surface of the second portion of the clip.

15. A semiconductor device package, comprising:
a substrate;
a clip disposed on the substrate, the clip comprising a first portion and a second portion separated from each other by a slit;
an encapsulant between the clip and the substrate, wherein the first portion of the clip has a first surface facing the slit and substantially coplanar with a surface of the encapsulant; and
an electronic component disposed on the clip, wherein the encapsulant has an opening exposing an upper surface of the clip, and the electronic component connects to the upper surface of the clip through the opening.

16. A semiconductor device package, comprising:
a substrate;
a clip disposed on the substrate, the clip comprising a first portion and a second portion separated from each other by a slit; and
an encapsulant between the clip and the substrate, wherein the first portion of the clip has a first surface facing the slit and substantially coplanar with a surface of the encapsulant;
wherein an upper surface of the encapsulant is exposed from an opening, and the upper surface of the encapsulant is below the first surface of the first portion of the clip.

17. A semiconductor device package, comprising:
a substrate;
a clip disposed on the substrate, the clip comprising a first portion and a second portion separated from each other by a slit; and
an encapsulant between the clip and the substrate, wherein the first portion of the clip has a first surface facing the slit and substantially coplanar with a surface of the encapsulant;
wherein the encapsulant at least partially encapsulates the clip and exposes the first surface.

18. The semiconductor device package of claim 17, wherein the second portion of the clip has a second surface facing the slit and a third surface angled with the second surface, and a surface roughness of the second surface is greater than a surface roughness of the third surface.

* * * * *